(12) United States Patent
Magnusen et al.

(10) Patent No.: US 7,242,918 B2
(45) Date of Patent: *Jul. 10, 2007

(54) CURRENT DRIVEN POLYPHASE FILTERS AND METHOD OF OPERATION

(75) Inventors: Timothy M. Magnusen, Murphy, TX (US); Kim E. Beumer, Richardson, TX (US)

(73) Assignee: Microtune (Texas), L.P., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/343,504

(22) Filed: Jan. 30, 2006

(65) Prior Publication Data

US 2006/0128341 A1 Jun. 15, 2006

Related U.S. Application Data

(60) Continuation of application No. 11/133,954, filed on May 20, 2005, now Pat. No. 6,993,310, which is a division of application No. 10/232,351, filed on Aug. 30, 2002, now Pat. No. 6,909,886.

(51) Int. Cl.
*H04B 1/10* (2006.01)
(52) U.S. Cl. .................................. 455/302; 455/307
(58) Field of Classification Search .............. 455/296, 455/302–307, 311–313, 323–324, 333, 318, 455/285; 327/552, 231, 113; 333/172, 167
See application file for complete search history.

(56) References Cited

U.S. PATENT DOCUMENTS

| | | | | |
|---|---|---|---|---|
| 5,140,198 A | * | 8/1992 | Atherly et al. | 327/113 |
| 5,870,670 A | * | 2/1999 | Ripley et al. | 455/304 |
| 6,029,059 A | * | 2/2000 | Bojer | 455/326 |
| 6,236,847 B1 | | 5/2001 | Stikvoort | 455/313 |
| 6,314,279 B1 | * | 11/2001 | Mohindra | 455/304 |
| 6,583,675 B2 | * | 6/2003 | Gomez | 331/17 |
| 6,696,885 B2 | | 2/2004 | Christensen | 327/552 |
| 6,778,594 B1 | | 8/2004 | Liu | 375/222 |
| 6,909,886 B2 | * | 6/2005 | Magnusen et al. | 455/307 |
| 6,980,787 B1 | * | 12/2005 | Dujmenovic | 455/318 |
| 6,993,310 B2 | * | 1/2006 | Magnusen et al. | 455/302 |
| 2002/0008983 A1 | | 1/2002 | Souto-Diez et al. | 363/159 |
| 2002/0080718 A1 | | 6/2002 | Stikvoort | 370/210 |
| 2003/0001648 A1 | | 1/2003 | Okazaki et al. | 327/252 |

FOREIGN PATENT DOCUMENTS

| | | |
|---|---|---|
| EP | 1 164 759 A2 | 12/2001 |
| JP | 2003283253 | 10/2003 |
| WO | WO 02/31962 A2 | 4/2002 |

* cited by examiner

*Primary Examiner*—Nguyen T. Vo
(74) *Attorney, Agent, or Firm*—Baker Botts L.L.P.

(57) ABSTRACT

A filter circuit includes a polyphase filter coupled to a first circuit component and a second circuit component. The first circuit component propagates four input current signals to the polyphase filter. The third and fourth input current signals are substantially one-hundred-eighty degrees out of phase with the first and second input current signals. The polyphase filter receives the input current signals and generates four output current signals that are out of phase with each other. The second circuit component generates first and second output signals using the four output current signals. The first and second output signals are ninety degrees out of phase with each other.

20 Claims, 2 Drawing Sheets

US 7,242,918 B2

CURRENT DRIVEN POLYPHASE FILTERS AND METHOD OF OPERATION

RELATED APPLICATIONS

This application is a continuation of U.S. patent application Ser. No. 11/133,954 entitled, "Current Driven Polyphase Filters and Method of Operation", filed May 20, 2005 now U.S. Pat. No. 6,993,310 which is a divisional of U.S. application Ser. No. 10/232,351 filed Aug. 30, 2002, now U.S. Pat. No. 6,909,886 B2 entitled, "Current Driven Polyphase Filters and Method of Operation", issued Jun. 21, 2005.

TECHNICAL FIELD OF THE INVENTION

This invention relates to circuits and more particularly to current driven polyphase filters.

BACKGROUND OF THE INVENTION

Polyphase filters are commonly used in communication systems for generating quadrature local oscillator (LO) signals from a single LO signal. Prior polyphase filters are driven by a voltage buffer and are characterized by a low impedance input. A drawback to this approach is that the voltage buffers require a significant amount of power in order to drive the polyphase filter linearly. Otherwise, third order distortion may result.

SUMMARY OF THE INVENTION

In accordance with the present invention, the disadvantages and problems associated with prior polyphase filters have been substantially reduced or eliminated.

In accordance with one embodiment of the present invention, a filter circuit includes a polyphase filter coupled to a first circuit component and a second circuit component. The first circuit component propagates a first input current signal, a second input current signal, a third input current signal, and a fourth input current signal. The third and fourth input current signals are substantially one-hundred-eighty degrees out of phase with the first and second input current signals.

The polyphase filter receives the first, second, third, and fourth input current signals. The polyphase filter further generates a first output current signal; a second output current signal that is substantially ninety degrees out of phase with the first output current signal; a third output current signal that is substantially one-hundred-eighty degrees out of phase with the first output current signal; and a fourth output current signal that is substantially two-hundred-seventy degrees out of phase with the first output current signal.

The second circuit component generates a first output signal using the first output current signal and the third output current signal. The first output signal is at a first phase. The second circuit component further generates a second output signal using the second output current signal and the fourth output current signal. The second output signal is at a second phase that is substantially ninety degrees out of phase with the first phase.

Another embodiment of the present invention is an image frequency rejection circuit that includes a first polyphase filter, a first mixer, a second mixer, and a second polyphase filter communicatively coupled to the first mixer and the second mixer. The first polyphase filter generates a first LO signal and a second LO signal that is substantially ninety degrees out of phase with the first LO signal. The first mixer receives an RF signal and the first LO signal and communicates a first IF current signal, a second IF current signal that is substantially one-hundred-eighty degrees out of phase with the first IF current signal, and at least a portion of an image frequency signal. The second mixer receives the RF signal and the second LO signal and communicates a third IF current signal that is substantially ninety degrees out of phase with the first IF current signal, a fourth IF current signal that is substantially two-hundred-seventy degrees out of phase with the first IF current signal, and at least a portion of the image frequency signal.

A phase shift associated with the first polyphase filter and a phase shift associated with the second polyphase filter combine to cancel the image frequency signal such that the second polyphase filter communicates a first IF output current signal, a second IF output current signal, a third IF output current signal, and a fourth IF output current signal. The second IF output current signal is substantially one-hundred-eighty degrees out of phase with the first IF output current signal. The third IF output current signal is substantially in phase with the first IF output current signal. The fourth IF output current signal is substantially one-hundred-eighty degrees out of phase with the first IF output current signal.

The following technical advantages may be achieved by some, none, or all of the embodiments of the present invention. Technical advantages of the current driven polyphase filter include a reduction in distortion and power savings. In particular, the current driven polyphase filter is driven linearly, such as by a voltage-to-current converter circuit, without significant power consumption. In this regard, the current driven polyphase filter generally does not receive and operate upon signals at the third order harmonic, or any other harmonic frequency, of the fundamental frequency. As a result, third order distortion is reduced, if not eliminated. These and other advantages, features, and objects of the present invention will be more readily understood in view of the following detailed description and the drawings.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF EXAMPLE EMBODIMENTS OF THE INVENTION

Figure 1:
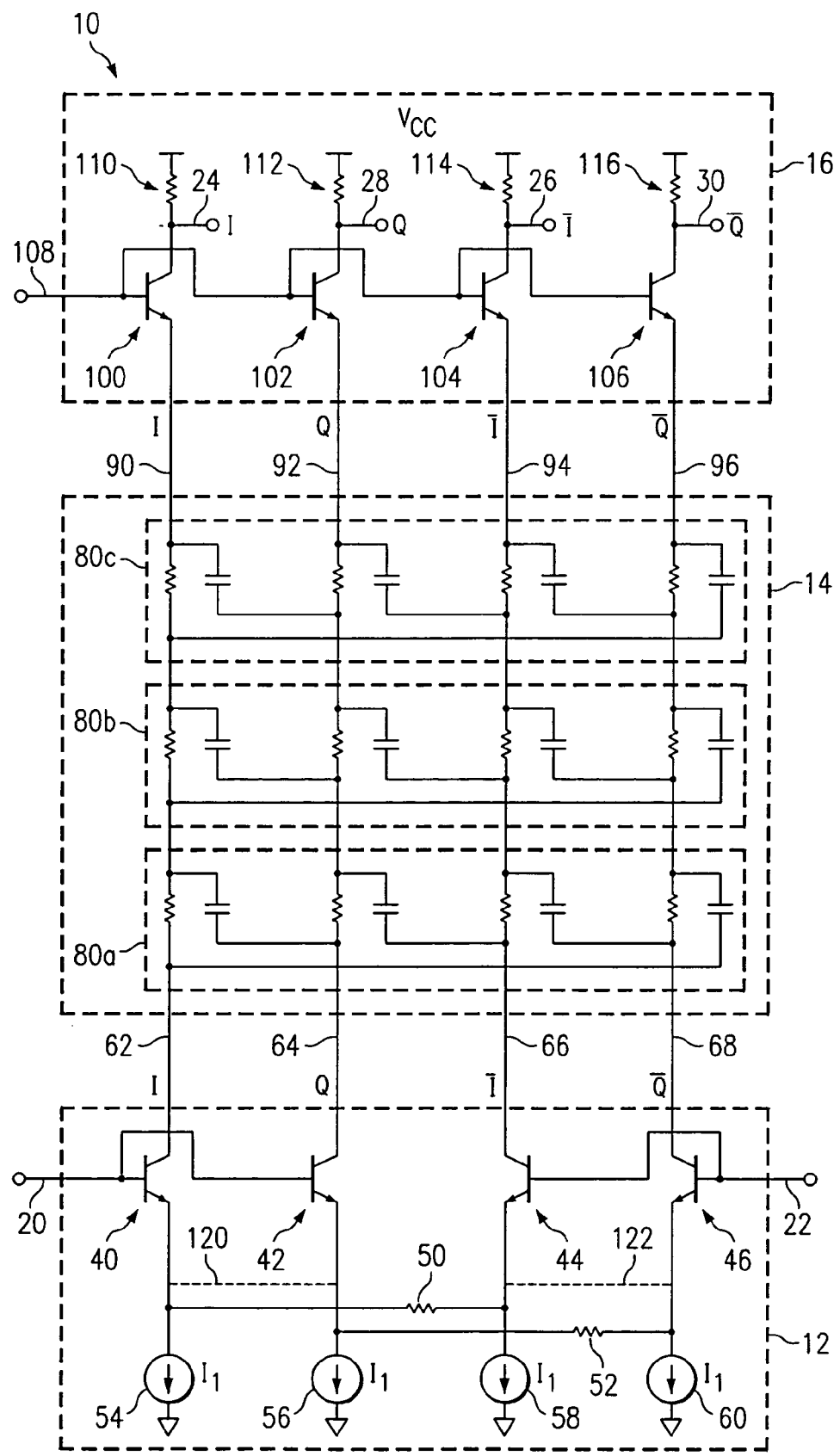
FIG. 1 illustrates one embodiment of a current driven polyphase filter.

FIG. 1 illustrates one embodiment of a filter circuit 10 that includes a first converter circuit 12, a current driven polyphase filter 14, and a second converter circuit 16. In general, circuit 10 receives a differential input voltage signal comprising first input voltage signal 20 and second input voltage signal 22, and generates a first differential output voltage signal comprising output voltage signals 24 and 26 at a first phase (e.g. 0 degrees) and a second differential output voltage signal comprising voltage signals 28 and 30 at a second phase (e.g., 90 degrees) that is phase shifted by ninety degrees from the first phase. In this regard, circuit 10 receives an input and generates a quadrature output.

Although the following description of circuit 10 is detailed with respect to differential input signals and differential output signals, it should be understood that circuit 10 and the current driven polyphase filter 14 of circuit 10 may operate upon single-ended input signals to generate single-ended quadrature output signals without departing from the scope of the present invention.

First converter circuit 12 comprises a voltage-to-current converter circuit that includes a first transistor 40, a second transistor 42, a third transistor 44, and a fourth transistor 46. Although the description of transistors 40–46 is detailed with respect to (npn) Bipolar Junction Transistors (BJTs), it should be understood that transistors 40–46 may comprise any suitable combination of (pnp) BJTs, Field Effect Transistors (FETs), Metal-Oxide Semiconductor Field Effect Transistors (MOSFETs) or any other suitable transistor. The base of first transistor 40 and the base of second transistor 42 are each coupled to first input voltage signal 20. The base of third transistor 44 and the base of fourth transistor 46 are each coupled to second input voltage signal 22. First and second input voltage signals 20 and 22 comprise substantially the same amplitude over a substantially similar range of frequencies, but are one-hundred eighty (180) degrees out of phase with each other. In a particular embodiment, signals 20 and 22 are generated by local oscillators at local oscillator frequencies.

In one embodiment, a resistor 50 couples the emitter of first transistor 40 with the emitter of third transistor 44. A resistor 52 couples the emitter of second transistor 42 with the emitter of fourth transistor 46. Resistors 50 and 52 generally help circuit 12 operate linearly. Current sources 54–60 are coupled to the emitters of transistors 40–46, respectively. Circuit 12 receives input voltages 20 and 22 and generates four input current signals 62, 64, 66, and 68, (e.g., in-phase signal (I); quadrature signal (Q); in-phase complement signal (–I); and quadrature complement signal (–Q)). Signals 66 (–I) and 68 (–Q) are one hundred eighty degrees out of phase with signals 62 (I) and 64 (Q). Current signals 62–68 are communicated to polyphase filter 14.

In some embodiments, the amplitude of input current signals 64 (Q) and 68 (–Q) are zero. This variation in amplitudes is achieved, in one embodiment, by cutting the metal trace 120 between the emitters of transistors 40 and 42, indicated by dashed lines, and by cutting the metal trace 122 between the emitters of transistors 44 and 46, indicated by dashed lines.

Polyphase filter 14 comprises a network of resistors and capacitors arranged in stages 80 to form a complex bandpass filter that receives input current signals 62, 64, 66, and 68, and generates output current signals 90, 92, 94, and 96 (e.g., I, Q, –I, and –Q) which are ninety degrees phase shifted apart. For example, signal 92 (Q) is ninety degrees out of phase with signal 90 (I). Signal 94 (–I) is one-hundred eighty degrees out of phase with signal 90 (I). Signal 96 (–Q) is two-hundred-seventy degrees out of phase with signal 90 (I). In general, polyphase filter 14 is tuned to operate over a range of frequencies such that it receives input signals at a fundamental frequency within the range of frequencies and generates the phase shifted output signals 90–96 at the fundamental frequency.

In a particular embodiment, polyphase filter 14 comprises three stages 80a, 80b, and 80c of resistors and capacitors. Stages 80a–c are generally referred to as stages 80. Although polyphase filter 14 is illustrated with three stages 80 of resistors and capacitors, it should be understood that polyphase filter 14 may comprise any suitable number of stages 80 to perform its operation. In general, the resistor and capacitor values within any given stage 80 are substantially the same. However, in one embodiment, first stage 80a has a higher impedance than second stage 80b, and second stage 80b has a higher impedance than third stage 80c.

In one embodiment, second converter circuit 16 comprises a current-to-voltage converter circuit that includes a first transistor 100, a second transistor 102, a third transistor 104, and a fourth transistor 106. Although the description of transistors 100–106 is detailed with respect to (npn) Bipolar Junction Transistors (BJTs), it should be understood that transistors 100–106 may comprise any suitable combination of (pnp) BJTs, Field Effect Transistors (FETs), Metal-Oxide Semiconductor Field Effect Transistors (MOSFETs) or any other suitable transistor. The base of each transistor 100–106 is coupled to a bias voltage 108. The emitter of each transistor 100–106 is coupled to polyphase filter 14. The collector of each transistor 100–106 is coupled to a corresponding resistor 110–116 and Vcc. Output voltage signals 24, 28, 26, and 30 are tapped at the node between the collector of each corresponding transistor 100–106 and the corresponding resistor 110–116. Output voltage signals 24 (I) and 26 (–I) form a first differential voltage signal at a first phase (e.g., 0 degrees). Output voltage signals 28 (Q) and 30 (–Q) form a second differential voltage signal at a second phase (e.g., 90 degrees) that is phase shifted by ninety degrees from the first phase.

Although the description of second converter circuit 16 is detailed with respect to a current-to-voltage converter circuit, it should be understood that converter circuit 16 comprises any suitable circuitry that converts current to voltage, current to power, or current to amplified current. For example, circuit 16 may comprise a transimpedance amplifier, a current amplifier, or any other suitable device to manipulate the form of signals 90–96.

In prior voltage driven polyphase filters, the current-to-voltage converter circuit 16 is combined with the voltage-to-current converter circuit 12 in a voltage buffer that drives the polyphase filter. It is typically the current-to-voltage converter circuit 16 that contributes significantly to the creation of input signals at harmonic frequencies, such as the third order harmonic, of the fundamental frequency. As a result, a voltage driven polyphase filter operates upon input signals at harmonic frequencies, resulting in distortion in the output signals of the polyphase filter. Therefore, in prior voltage driven polyphase filters where the current-to-voltage converter circuit 16 was arranged at the input of the polyphase filter, the voltage buffer required significant power in order to drive the polyphase filter linearly.

A particular advantage of polyphase filter 14 of circuit 10 is that it receives and operates upon input signals 62–68 in the current domain. In circuit 10, current-to-voltage converter circuit 16—the primary source of signals at harmonic frequencies—is arranged at the output of polyphase filter 14. Therefore, current driven polyphase filter 14 does not receive and operate upon signals at the third order harmonic, or any other harmonic frequency, of the fundamental frequency. As a result, the deleterious effects of the current-to-voltage circuit 16 have no impact on the phase shifting operations of current driven polyphase filter 14 in circuit 10. In this regard, third order distortion is reduced, if not eliminated. Moreover, current-to-voltage converter circuit 16 arranged at the output of polyphase filter 14 requires less power to drive subsequent circuit components than it does when it is arranged to drive a voltage driven polyphase filter. In this regard, circuit 10 realizes power savings.

Although polyphase filter 14 is described in FIG. 1 with reference to a Local Oscillator (LO) polyphase filter, it should be understood that current driven polyphase filter 14 may also comprise an Intermediate Frequency (IF) polyphase filter. IF polyphase filter 14 also receives input current signals 62 (I), 64 (Q), 66 (−I) and 68 (−Q) and generates output current signals 90 (I), 92 (Q), 94 (−I), and 96 (−Q). However, the phase relationships of input current signals 62–68 and output current signals 90–96 associated with IF polyphase filter 14 are different from those associated with LO polyphase filter 14.

For example, with respect to input current signals 62–68 associated with IF polyphase filter 14, signal 64 (Q) is ninety degrees out of phase with signal 62 (I). Signal 66 (−I) is one-hundred eighty degrees out of phase with signal 62 (I). Signal 68 (−Q) is two-hundred-seventy degrees out of phase with signal 62 (I). Moreover, the amplitude of input current signals 62 (I) and 66 (−I) are substantially the same.

With respect to signals 90–96 associated with IF polyphase filter 14, signals 94 (−I) and 96 (−Q) are one-hundred-eighty degrees out of phase with signals 90 (I) and 92 (Q). Output voltage signals 24 (I) and 28 (Q) form a first differential voltage signal at a first phase (e.g., 0 degrees). Output voltage signals 26 (−I) and 30 (−Q) form a second differential voltage signal at a second phase (e.g., 180 degrees) that is phase shifted by one-hundred-eighty degrees from the first phase.

It should be understood that IF polyphase filter 14 of circuit 10 may also operate upon single-ended input signals to generate single-ended output signals.

Figure 2:
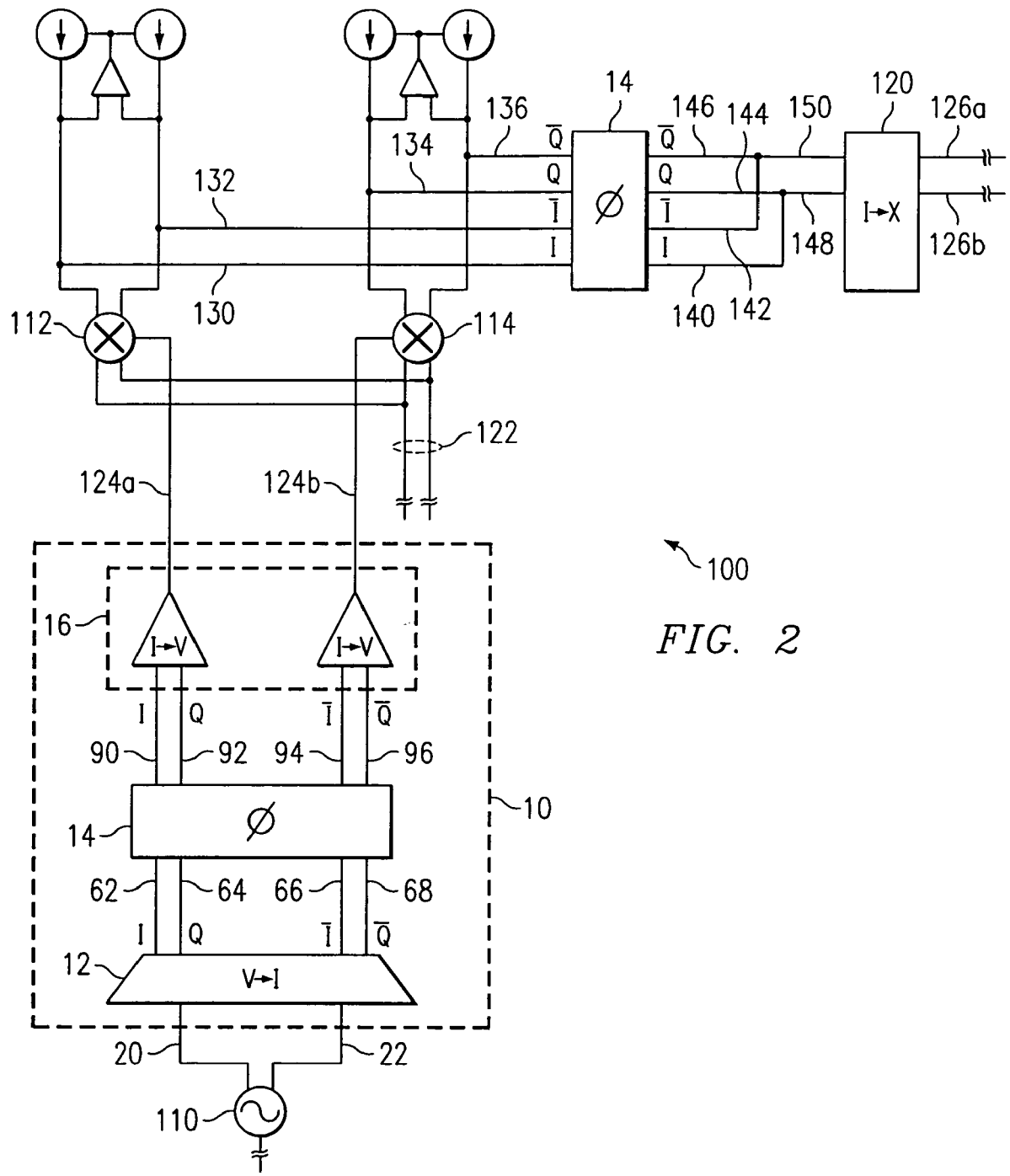
FIG. 2 illustrates one embodiment of an image frequency rejection circuit using the current driven polyphase filter of FIG. 1.

FIG. 2 illustrates one embodiment of an image frequency rejection circuit 100 that includes a local oscillator 110, LO polyphase filter 14, mixers 112 and 114, IF polyphase filter 14, and converter circuit 120. In general, circuit 100 modifies the frequency of incoming RF signals 122 using the frequency of LO signals 124a and 124b to generate signals 126a and 126b at a desired intermediate frequency (IF). In doing so, circuit 100 uses the phase shifts associated with LO and IF polyphase filters 14 to cancel any image frequency signals generated by mixers 112 and 114. A particular advantage of circuit 100 is that either or both of LO polyphase filter 14 and IF polyphase filter 14 operate in the current domain.

Local oscillator 110 comprises a device that generates signals 20 and 22 at a selected frequency. Signals 20 and 22 form a differential voltage signal, also referred to as an LO signal. Filter circuit 10 receives signals 20 and 22, and generates a first LO signal 124a and a second LO signal 124b that is ninety degrees out of phase with first LO signal 124a. The operation of filter circuit 10 is described in greater detail above with reference to FIG. 1. Although LO signals 124a and 124b are described as being generated by a current driven LO polyphase filter 14 (as a part of filter circuit 10), it should be understood that LO polyphase filter 14 may be voltage driven without departing from the scope of circuit 100.

Mixers 112 and 114 receive RF signals 122. In one embodiment, circuit 100 forms a portion of a broadband integrated television tuner that receives RF signals 122 from a variety of sources, such as an antenna or a cable television line. In this embodiment, RF signals 122 may span the television frequency band. Mixers 112 and 114 comprise bolometers, photoconductors, Schottky diodes, quantum non-linear devices (e.g. SIS receivers or Josephson junction mixers), variable gain amplifiers or any other suitable device that multiplies RF signals with LO signals to generate IF signals. For example, mixer 112 multiplies RF signals 122 with LO signal 124a to generate IF signals 130 and 132. Mixer 114 multiplies RF signals 122 with LO signal 124b to generate IF signals 134 and 136. In doing so, mixers 112 and 114 may generate undesired image frequency signals (not shown) which can interfere with the desired signals. In a particular embodiment the image frequency signals comprise (RF+2*IF).

Signal 132 is substantially one hundred-eighty degrees out of phase with signal 130. Signal 134 is ninety degrees out of phase with signal 130. Signal 136 is two hundred-seventy degrees out of phase with signal 130. In one embodiment, signals 130–136 propagate from mixers 112 and 114 to IF polyphase filter 14 in the current domain. IF polyphase filter 14 receives 130–136 along with the unwanted image frequency signals generated by mixers 112 and 114. The phase shifts associated with LO polyphase filter 14 and IF polyphase filter 14 combine to remove unwanted frequencies, including the image frequencies, from the IF signals. IF polyphase filter 14 generates output signals 140, 142, 144, and 146. Signals 140 and 144 combine to form signal 148. Signals 142 and 146, which are one hundred-eighty degrees out of phase with signals 140 and 144, combine to form signal 150. The detailed operation of IF polyphase filter 14 is described above with reference to FIG. 1.

A particular advantage of one embodiment of circuit 100 is that IF polyphase filter 14 operates upon current signals 130–136 to generate current signals 140–146. By operating in the current domain, polyphase filter 14 requires less power and circuit 100 removes current-to-voltage conversion circuitry and voltage buffers between mixers 112, 114 and polyphase filter 14. This yields a significant savings in bias current while still providing linearity within circuit 100. Moreover, parasitic capacitances on intermediate lines within circuit 100 are no longer significant design considerations.

Converter circuit 120 comprises any suitable circuitry that converts current to voltage, current to power, or current to amplified current. For example, circuit 120 may comprise a transimpedance amplifier, a current amplifier, or any other suitable device to manipulate the form of signals 126a and 126b. Signals 126a and 126b comprise IF signals represented as currents, voltages, or power based upon the type of converter circuit 120 that is used in circuit 100.

Although the present invention has been described in detail, it should be understood that various changes, substitutions and alterations can be made hereto without departing from the sphere and scope of the invention as defined by the appended claims.

To aid the Patent Office, and any readers of ant patent issued on this application in interpreting the claims appended hereto, applicants wish to note that they do not intend any of the appended claims to invoke ¶6 of 35 U.S.C § 112 as it exits on the date of filing hereof "means for" or "step for" are used in the particular claim.

What is claimed is:

1. An image frequency rejection circuit, comprising:
   a first polyphase filter operable to generate a first LO signal and a second LO signal;
   a first mixer operable to receive an RF signal and the first LO signal, the first mixer further operable to communicate a first IF signal, a second IF signal, and at least a portion of an image frequency signal;
   a second mixer operable to receive the RF signal and the second LO signal, the second mixer further operable to communicate a third IF signal, a fourth IF signal, and at least a portion of the image frequency signal; and a second polyphase filter communicatively coupled to the first mixer and the second mixer, wherein a phase shift associated with the first polyphase filter and a phase shift associated with the second polyphase filter combine to cancel the image frequency signal.

2. The circuit of claim 1, wherein the second LO signal is substantially ninety degrees out of phase with the first LO signal.

3. The circuit of claim 1, wherein the first IF signal and the second IF signal are current signals.

4. The circuit of claim 1, wherein the second IF signal is substantially one-hundred eighty degrees out of phase with the first IF signal.

5. The circuit of claim 1, wherein the third IF signal is substantially ninety degrees out of phase with the first IF signal.

6. The circuit of claim 1, wherein the fourth IF signal is substantially two-hundred-seventy degrees out of phase with the first IF signal.

7. The circuit of claim 1, wherein the second polyphase filter communicates a first IF output current signal, a second IF output current signal that is substantially one-hundred-eighty degrees out of phase with the first IF output current signal, a third IF output current signal that is substantially in phase with the first IF output current signal, and a fourth IF output current signal that is substantially one-hundred-eighty degrees out of phase with the first IF output current signal.

8. The circuit of claim 7, further comprising a current-to-voltage converter circuit coupled to the second polyphase filter and operable to generate a first IF voltage signal using the first and third IF current output signals, and to generate a second IF voltage signal using the second and fourth IF current output signals, wherein the second IF voltage signal is substantially one-hundred-eighty degrees out of phase with the first IF voltage signal.

9. The circuit of claim 1, further comprising:
a first circuit component coupled to the input of first polyphase filter and operable to propagate a first input current signal, a second input current signal, a third input current signal, and a fourth input current signal, wherein the third and fourth input current signals are substantially one-hundred-eighty degrees out of phase with the first and second input current signals;
wherein the first polyphase filter is further operable to:
receive the first, second, third, and fourth input current signals;
generate a first output current signal;
generate a second output current signal that is substantially ninety degrees out of phase with the first output current signal;
generate a third output current signal that is substantially one-hundred-eighty degrees out of phase with the first output current signal; and
generate a fourth output current signal that is substantially two-hundred-seventy degrees out of phase with the first output current signal;
and wherein:
the first output current signal and the third output current signal form the first LO signal; and
the second output current signal and the fourth output current signal form the second LO signal.

10. The circuit of claim 1, wherein the image frequency rejection circuit forms a portion of a television tuner and the RF signal spans at least a portion of a television frequency band.

11. A method for rejecting image frequency signals, comprising:
generating a first LO signal and a second LO signal;
mixing an RF signal and the first LO signal to generate a first IF signal, a second IF signal, and at least a portion of an image frequency signal;
mixing the RF signal and the second LO signal to generate a third IF signal, a fourth IF signal, and at least a portion of the image frequency signal; and
attenuating the image frequency signal in response to phase shifts associated with at least a portion of the LO signals and the IF signals.

12. The method of claim 11, wherein the second LO signal is substantially ninety degrees out of phase with the first LO signal.

13. The method of claim 11, wherein the first IF signal and the second if signal are current signals.

14. The method of claim 11, wherein the second IF signal is substantially one-hundred eighty degrees out of phase with the first IF signal.

15. The method of claim 11, wherein the third IF signal is substantially ninety degrees out of phase with the first IF signal.

16. The method of claim 11, wherein the fourth IF signal is substantially two-hundred-seventy degrees out of phase with the first IF signal.

17. The method of claim 11, further comprising communicating a first IF output current signal, a second IF output current signal that is substantially one-hundred-eighty degrees out of phase with the first IF output current signal, a third IF output current signal that is substantially in phase with the first IF output current signal, and a fourth IF output current signal that is substantially one-hundred-eighty degrees out of phase with the first IF output current signal.

18. The method of claim 17, further comprising:
generating a first IF voltage signal using the first and third IF current output signals; and
generating a second IF voltage signal using the second and fourth IF current output signals;
wherein the second IF voltage signal is substantially one-hundred-eighty degrees out of phase with the first IF voltage signal.

19. An image frequency rejection circuit, comprising:
a first circuit component operable to propagate a plurality of input current signals;
a polyphase filter operable to receive the plurality of input current signals and to generate a plurality of output current signals out of phase with each other; and
a second circuit component operable to generate a first output signal at a first phase and a second output signal at a second phase that is substantially ninety degrees out of phase with the first phase;
wherein the first output signal is generated using a first pair of output current signals that are one-hundred-eighty degrees out of phase with each other, and the second output signal is generated using a second pair of output current signals that are one-hundred-eighty degrees out of phase with each other.

20. The circuit of claim 19, wherein a phase shift associated with the polyphase filter contributes to the attenuation of an image frequency signal generated by a mixer.

* * * * *